United States Patent
Trott et al.

(10) Patent No.: US 6,931,583 B2
(45) Date of Patent: Aug. 16, 2005

(54) DECODING EXTENDED ERROR CORRECTING CODES USING SOFT INFORMATION

(75) Inventors: Mitchell D. Trott, Mountain View, CA (US); Tibor Boros, San Francisco, CA (US)

(73) Assignee: Arraycomm, Inc., San Jose, CA (US)

( * ) Notice: Subject to any disclaimer, the term of this patent is extended or adjusted under 35 U.S.C. 154(b) by 5 days.

(21) Appl. No.: 10/394,793

(22) Filed: Mar. 21, 2003

(65) Prior Publication Data

US 2004/0187072 A1 Sep. 23, 2004

(51) Int. Cl.[7] .................... H03M 13/00; G06F 11/00
(52) U.S. Cl. .................................. 714/780; 714/800
(58) Field of Search ....................... 714/780, 800–802, 714/755, 786

(56) References Cited

U.S. PATENT DOCUMENTS

| | | | | |
|---|---|---|---|---|
| 4,763,331 A | * | 8/1988 | Matsumoto | 714/759 |
| 5,461,629 A | * | 10/1995 | Sutterlin et al. | 714/746 |
| 5,828,676 A | * | 10/1998 | Hurlbut et al. | 714/752 |
| 6,526,538 B1 | * | 2/2003 | Hewitt | 714/780 |

* cited by examiner

*Primary Examiner*—Shelly A Chase

(74) *Attorney, Agent, or Firm*—Blakely Sokoloff Taylor & Zafman LLP

(57) ABSTRACT

In one embodiment, the present invention can be used to correct one more error in an extended codeword encoded with a block code and a single parity check code than the block code is able to correct. In one embodiment, a communications device includes a decoder that has a soft decoder to receive an extended codeword and a strength of each bit of the extended codeword, and to produce a codeword by soft decoding the extended codeword using the received strengths, and a block decoder coupled to the soft decoder to produce a corrected codeword by block decoding the codeword using an error correcting block code.

13 Claims, 6 Drawing Sheets

DECODING EXTENDED ERROR CORRECTING CODES USING SOFT INFORMATION

BACKGROUND OF THE INVENTION

1. Field of the Invention

The present invention applies to the field of data coding and, in particular, to an error-correcting decoder.

2. Description of the Prior Art

Digital devices, such as computers and various digital communications equipment, store and process data as binary digits, also known as bits. A bit is either zero or one ("0" or "1"). All digital information, such as mp3 files, jpeg images, text files, DVD movies, and so on are stored as a collection of bits. When bits are transferred over a communication medium, errors may be introduced so that the bits received are not identical to the original bits. To ensure the accuracy of received data, various error detection and correction devices have been developed, such as, e.g., parity check codes, checksums, block codes, and cyclic redundancy checks.

Parity check codes are well known. A parity check code adds a single parity bit to a block of data bits so that the number of "1" bits is even. Odd parity checking works in the same manner, except the number of "1" bits is made to be odd. For example, over the block "0011010110" the parity bit added would be "1," because there are five "1s" in the block, which is an odd number, and one more "1" makes it even.

Block codes, such as Hamming codes, are also well known. An error correcting block generates a codeword using a block of data bits. The codewords contain enough redundancy to be used to correct a predetermined number of bit errors, the number depending on the amount of redundancy. Block codes are based on the principle that if allowed codewords are kept a minimum distance from each other, errors can be corrected. For example, allowed Hamming codewords are three bit differences apart from all other Hamming codewords. Thus, the Hamming code can correct one error. Codes can be developed to correct any number of errors.

Block codes can either be used to correct errors or to detect them. A block code can generally detect a larger number of errors than it can correct. For example, the Hamming code can detect two errors. An extended block code encodes a block of data using both a block encoder and a single parity check code. An advantage of this is that the extended block code can sometimes detect one more error than the block code can detect. For example, a Hamming code can detect two errors and an extended Hamming code can detect three errors. However, both the Hamming code and the extended Hamming code can only be used to correct one error. Traditional decoding of extended codewords does not increase the error correction capabilities of the block code. The extended block code cannot be used to correct more errors than the block code alone.

BRIEF SUMMARY OF THE INVENTION

In one embodiment, the present invention can be used to correct one more error in an extended codeword encoded with a block code and a single parity check code than the block code is able to correct. In one embodiment, a communications device includes a decoder that has a soft decoder to receive an extended codeword and a strength of each bit of the extended codeword, and to produce a codeword by soft decoding the extended codeword using the received strengths, and a block decoder coupled to the soft decoder to produce a corrected codeword by block decoding the codeword using an error correcting block code.

BRIEF DESCRIPTION OF THE DRAWINGS

The present invention is illustrated by way of example, and not by way of limitation, in the figures of the accompanying drawings in which like reference numerals refer to similar elements and in which.

DETAILED DESCRIPTION OF THE INVENTION

According to one embodiment of the invention, an extended Hamming code is capable of correcting two errors using the soft information that is a byproduct of demodulation. In one embodiment, the extended codeword is soft decoded only if the parity checks and then block decoded to correct either the second error or the error introduced during soft decoding.

Decoding the Extended Codeword

Figure 1:
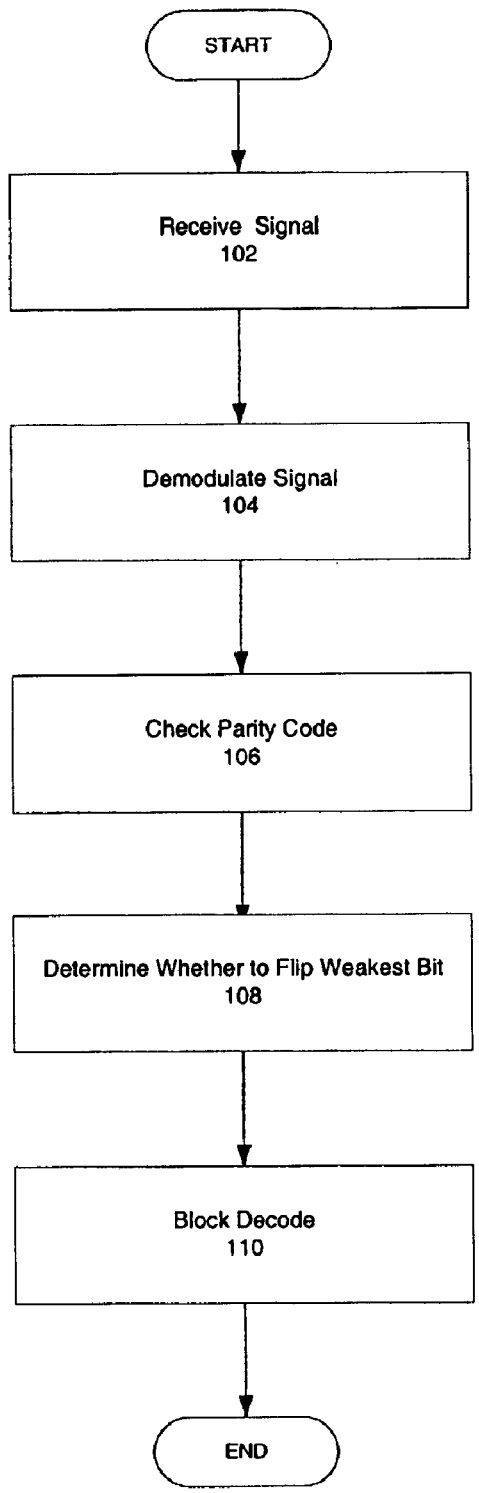
FIG. 1 is a flow diagram of decoding processing according to one embodiment of the present invention.

One embodiment of the present invention is discussed with reference to FIG. 1. FIG. 1 is a flow chart showing a method for receiving and decoding a signal containing an extended codeword, according to one embodiment. First, a signal containing the extended codeword is received 102. The signal can be received through any communication medium, including for example radio waves, coax cable, or twisted pair.

The signal is then demodulated 104 using any demodulation technique. Demodulation includes deriving binary data from constellation points. Constellation points are well known. Constellation points can be represented as complex coordinates that stand for the in-phase and quadrature components of received waveforms, and are sometimes referred to as I/Q points.

As a simple example, in the binary phase shift keying (BPSK) modulation format the two possible constellation points are (1,0) and (−1,0). On an X-Y coordinate plane they appear as the numbers 1 and −1. The BPSK demodulator can map a "1" bit to 1 and a "0" bit to −1. In one embodiment, the constellation points received by the BPSK demodulator appear are real numbers, e.g., 1.12, 0.25, −0.13, −0.88. The BPSK demodulator would map these point to data bits by first hard-limiting them to either 1 or −1, the two allowed constellation points in BPSK. In one embodiment, the demodulator can use the distance each point is from an allowed constellation point to perform this limiting; therefore, in this example the data bits would be "1100."

Some data bits are more probably correct than others. In this example, since zero (0) is the midpoint between the two allowed constellation point, zero is the decision boundary. Numbers to the right of the decision boundary, i.e. positive number, are hard limited to "1" and numbers to the left of the decision boundary, i.e., negative numbers, are hard limited to −1. The closer each point is to the decision boundary, the higher the likelihood of an error.

In the above example, the distance between each received constellation point and the decision boundary can be calculated. As shown above, this distance is related to the likelihood of error in the transmission of the bit. Thus, this distance can be referred to as the "strength" of a bit. For example, the strengths of the bits are 1.12, 0.25, 0.13, and 0.88 respectively. In this BPSK example, the strength of each bit is the value of its received constellation point.

In this example, the weakest bit among these four is the third bit because it has the smallest strength, that is, its constellation point lies closest to the decision boundary. In certain embodiments, a similar concept of distance from a decision line can be used determine bit strengths for other modulation formats, such as QPSK, 8-PSK, 16-QAM, or any other constellation based modulation scheme. In other embodiments, for example where the noise is not random, other methods exist for determining the strength of each bit of the extended codeword.

The result of demodulating 104 the signal is the extended codeword in bits and the strength of each bit. The codeword is the received version of the codeword produced by the encoder. As explained above, the extended codeword is produced at the transmitter by encoding a block of data bits using a block encoder, and encoding the resulting codeword with a single parity check code. The bit strengths are a byproduct of the demodulation process but can also be calculated independently.

Next, the parity of the demodulated extended codeword is checked 106. Assuming even parity is used, this can be done by adding the number of "1" bits in the extended codeword and checking whether the resulting number is even. In hardware this can also be done using an exclusive or ("XOR") gate and a feedback register.

Then, it is determined 108 whether the weakest bit of the extended codeword should be flipped, meaning made "1" if "0" and made "0" if "1." In one embodiment, the determination is based on the result of the parity checking 106. If it is determined 108 that the weakest bit should be flipped, then the weakest bit is located by finding the bit with the smallest distance from a decision boundary, and then complemented, i.e. flipped. If it is determined 108 that the weakest bit should not be flipped, then no action is taken. In either case, the parity bit can then be removed from the extended codeword, and the resulting codeword can be block decoded 110.

Figure 2:
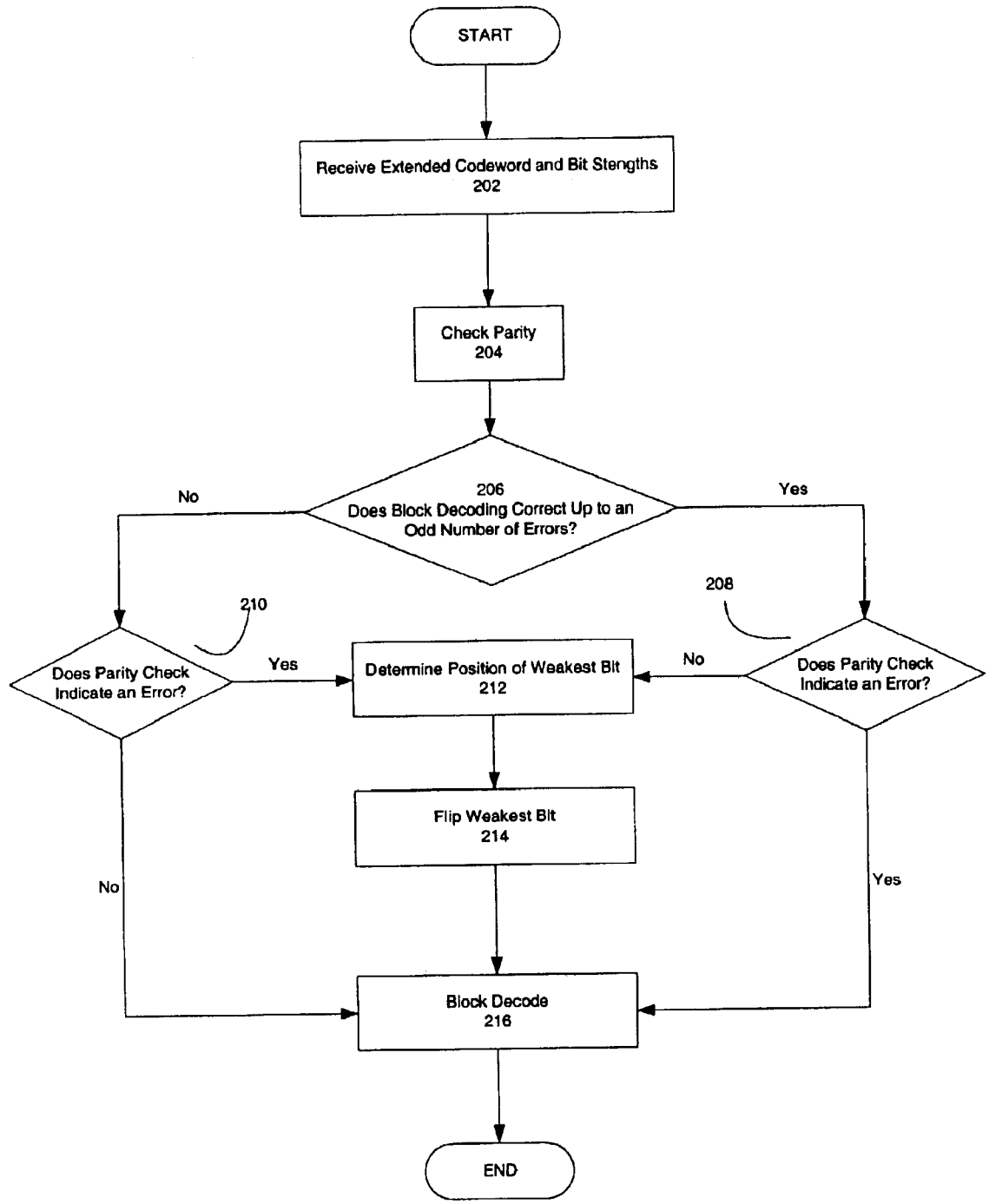
FIG. 2 is a detailed flow diagram of decoding processing according to another embodiment of the present invention.

A more detailed explanation of how the determination 108 whether to flip the weakest bit is made according to one embodiment of the present invention is set forth with reference to FIG. 2. First, the extended codeword and the strengths of the bits of the extended codeword are received 202, after demodulation, as discussed above with reference to FIG. 1. The parity is checked 204, as discussed with reference to FIG. 1.

In one embodiment, the processing depends 206 on whether the block decoding corrects an even or an odd number of errors. This information will generally be fixed in the decoder, thus, this determination will not need to be made during the operation of the decoder. If the block decoder can correct up to an odd number of errors 206, e.g. a Hamming decoder, then the weakest bit is flipped 214— after being located 212—if the parity checking 208 does not indicate an error. However, if the block decoder can correct up to an even number of errors 206, e.g. a two error-correcting block code, then the weakest bit is flipped 214 if the parity checking 210 does indicate an error. In either case, the result is block decoded 216 as discussed with reference to FIG. 1.

Demonstrative Example

As an example, at the encoder, the data bits "1011" are encoded with a Hamming code that inserts three parity bits in positions four, six, and seven into the Hamming codeword "1010100." At the encoder, the parity check code adds one more bit to make the total number of "1" bits even. In this case, the extended codeword is therefore "10101001." After transmission, the received 202 and demodulated extended codeword is "11001001," and the respective bit strengths are 1.20, 0.12, 0.30, 1.23, 0.54, 1.11, and 0.33.

The parity of the extended codeword is checked 204. Since the number of "1" bits is four, the parity checks. The Hamming code corrects up to one error, which is an odd number. The parity check indicates no errors 208. Thus, the weakest bit position is determined 212. The smallest distance to the decision boundary is 0.12, thus the bit in the second position is the weakest bit. Then, this bit is flipped 214. The extended codeword is now "10001001." The last bit is the extra parity bit, which can now be removed resulting in "1000100." The codeword "1000100" now has only one error in the third position, and is thus correctible by Hamming block decoding 216.

In the example above, two errors introduced during transmission have been corrected. Were there no errors during transmission, the parity would still check. Then, when the weakest bit is flipped, one error would be introduced into the codeword, which can still be corrected using Hamming decoding. This quick demonstration was only one example. The invention is not limited to any particular code length, error-correction capability in the block decoder, or any other specific characteristic of this example.

Decoder Architecture

Figure 3:
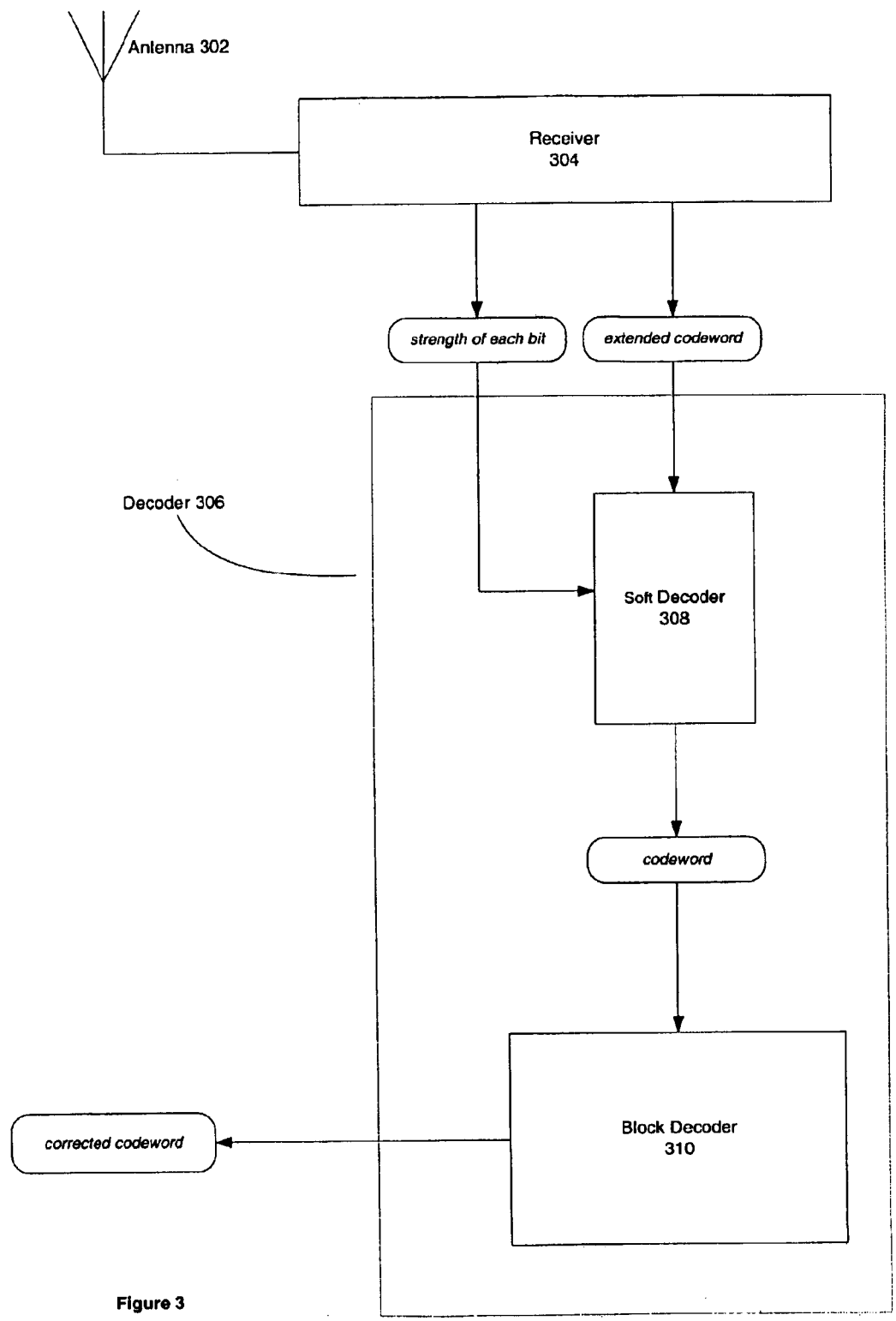
FIG. 3 is a simplified block diagram of an extended decoder according to one embodiment of the present invention.
Figure 4:
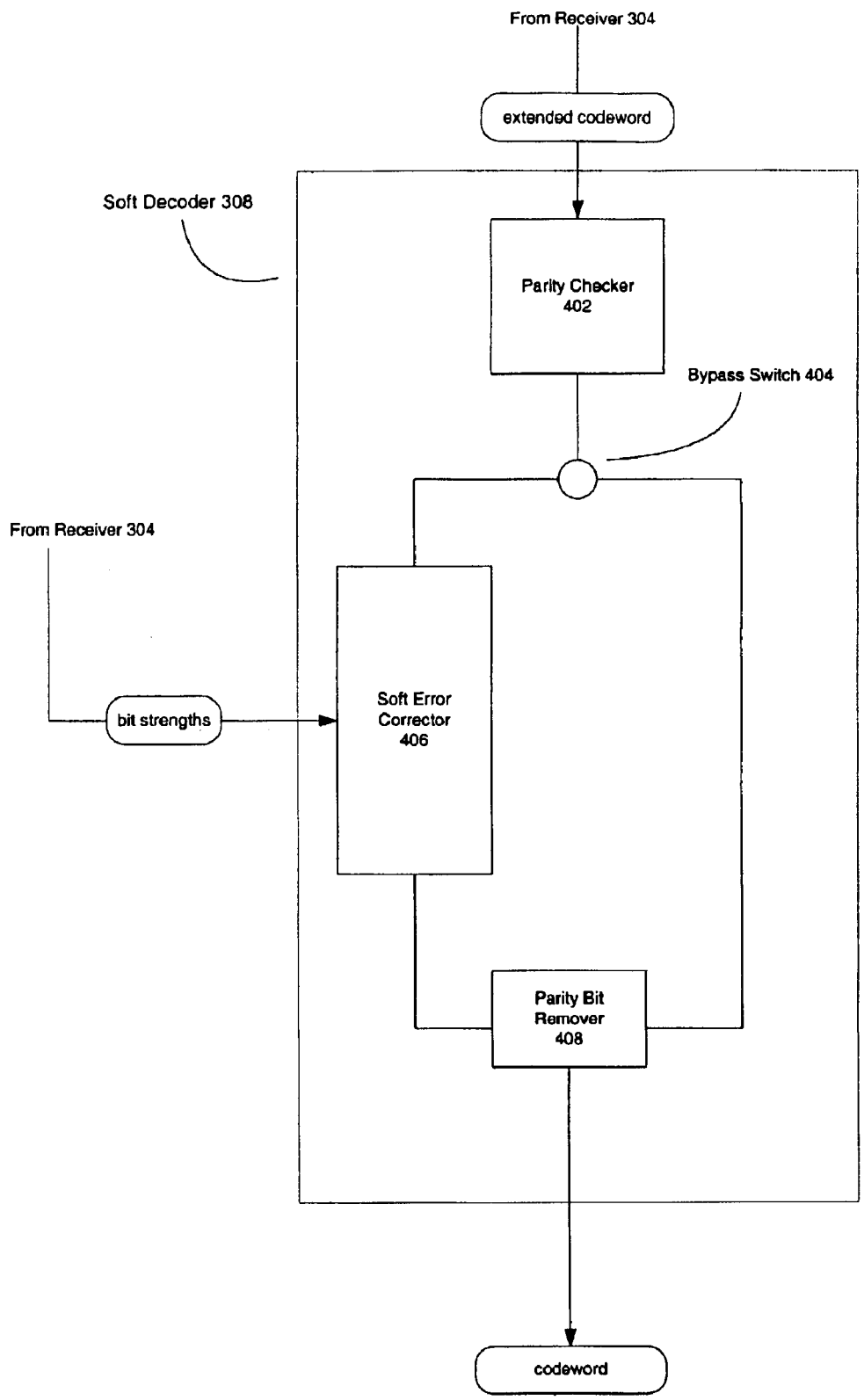
FIG. 4 is a simplified block diagram of a soft decoder component of the extended decoder according to an embodiment of the present invention.
Figure 5:
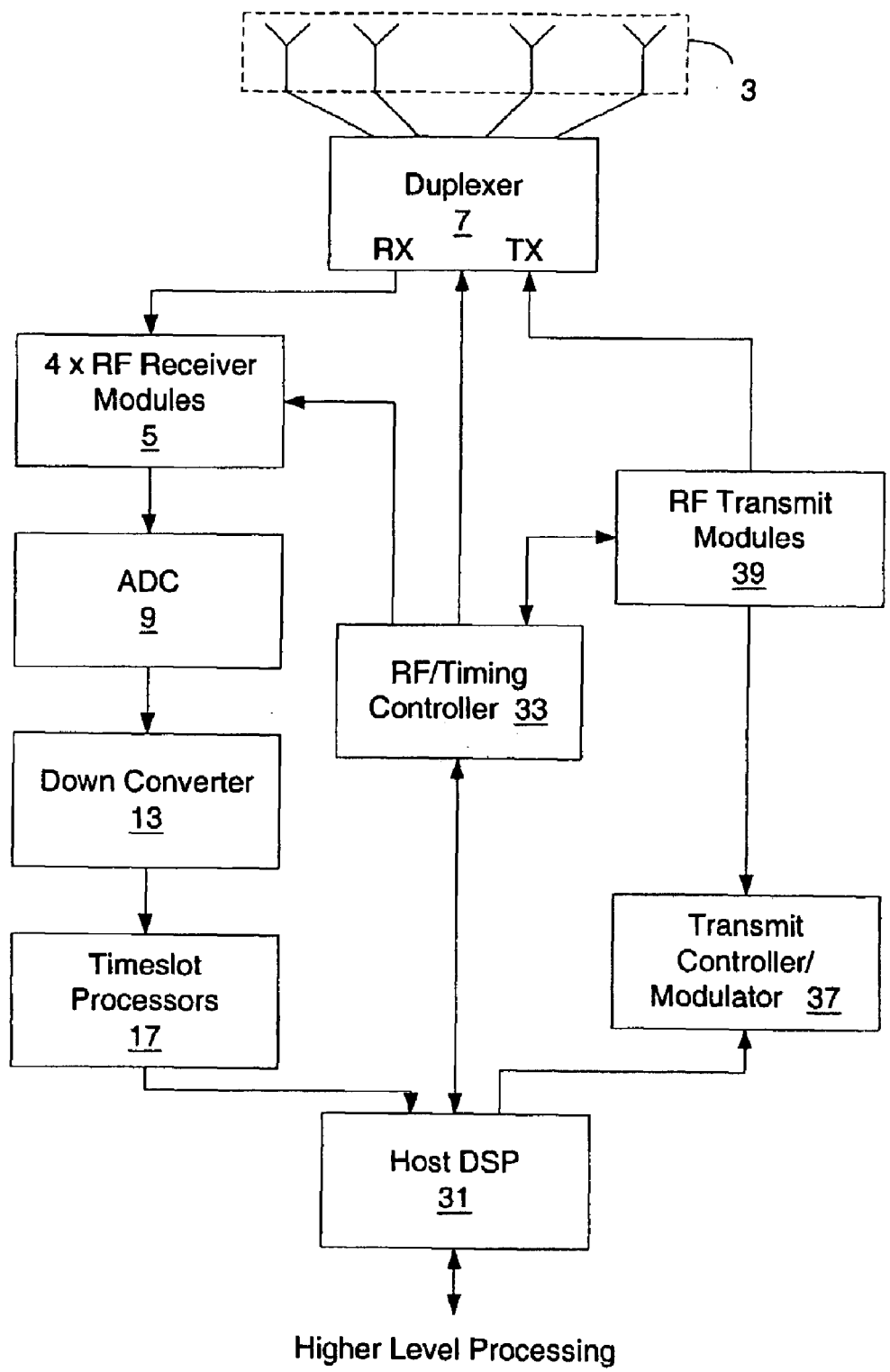
FIG. 5 is a simplified block diagram of a base station on which an embodiment of the invention can be implemented.
Figure 6:
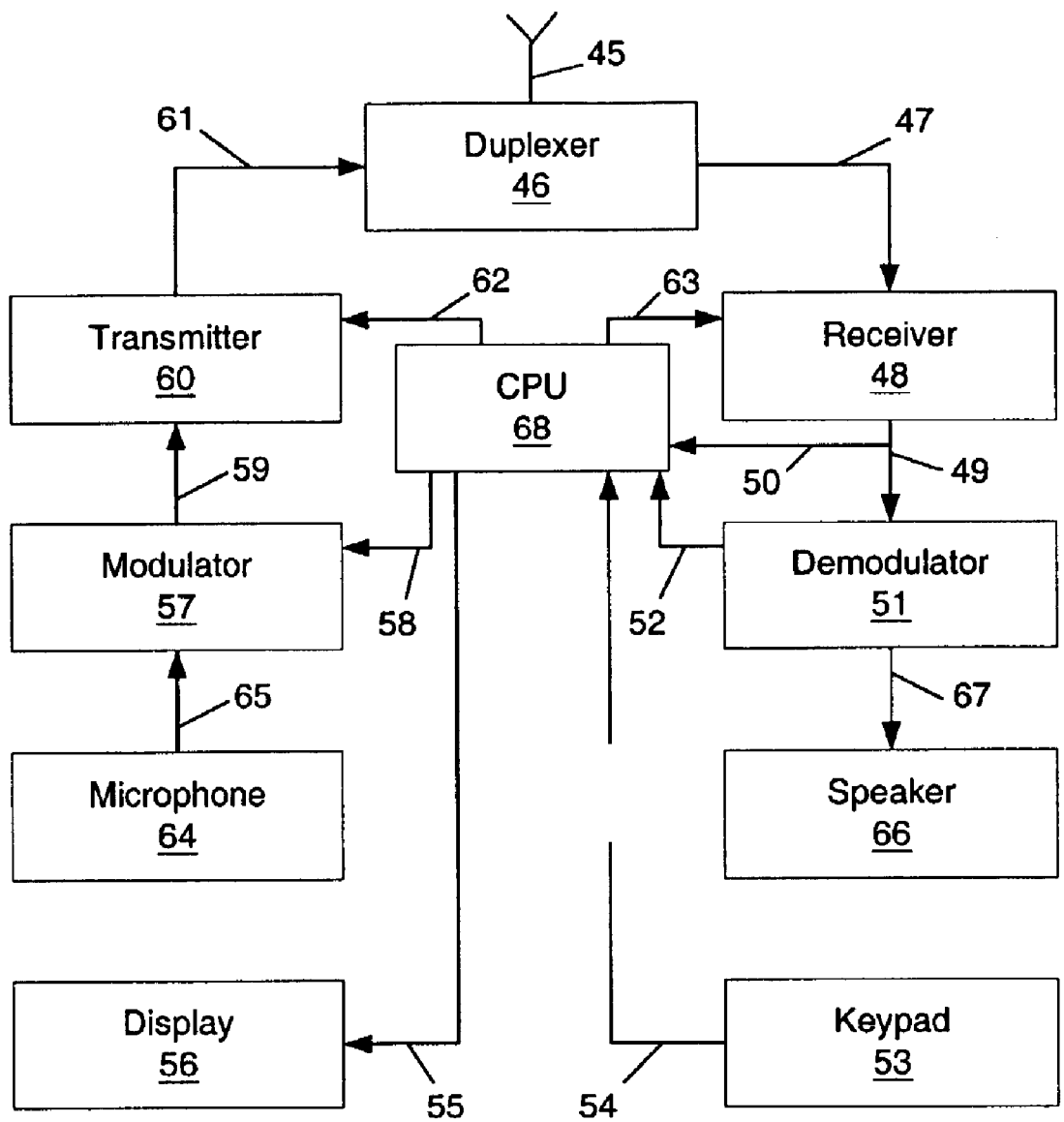
FIG. 6 is a simplified block diagram of a remote terminal on which an embodiment of the invention can be implemented.

One embodiment of the decoder architecture is described with reference to FIGS. 3 and 4 below. Data values produced by the components shown in FIGS. 3 and 4 are shown as ovals. The decoder 306 in FIG. 3 is shown in the context of a radio communications device that includes an antenna 302 that receives radio signals and a receiver 304 that demodulates the signals to extract the extended codeword, and to produce or calculate the relative strength of each bit. In other embodiments, the receiver 304 can be configured to receive signals on different communications media.

The extended codeword and the bit strengths are then passed to the soft decoder 308. One embodiment of the soft decoder is shown in detail in FIG. 4. With reference to FIG. 4, the extended codeword is passed to a parity checker 402 that checks the parity of the extended codeword. The parity checker is connected to a bypass switch 404 that allows the extended codeword to bypass the error corrector 406 when instructed to do so by the parity checker. In one embodiment—where the block decoder 310 can correct up to an odd number of errors—the parity checker activates the bypass switch 404 to bypass the soft error corrector 406 if the parity checker 402 indicates that the parity checks, i.e. indicates no errors. In another embodiment, the parity checker activates the bypass switch 404 to bypass the soft error corrector 406 if the parity does not check, i.e. indicates an error.

When the soft error corrector 406 is not bypassed, it uses the bit strengths to find the position of the weakest bit, and flips this bit. Whether the soft error corrector is bypassed or not, the parity bit from the parity check code is removed by the parity bit remover 408, and a codeword is then output from the soft decoder 308 to the block decoder 310. The block decoder 310 can be a linear block decoder, a Hamming decoder, or any other block decoder configured to locate and correct some number of bit errors. The corrected codeword is then output from the decoder 306. In other embodiments, the block decoder 310 can also remove the parity bits it uses, and only output the corrected data bits.

In one embodiment, the architecture described with reference to FIGS. 3 and 4 allows for the correction of one more bit than would be possible using a block decoder alone. This architecture only requires the block decoder to compute the syndrome once. In this architecture, the soft decoder 308 introduces errors from time to time, but only when the block decoder 310 will correct these errors.

Base Station Structure

The decoder 306 described with reference to FIGS. 3 and 4 can be used for error correction in any communications system. A base station and a user terminal of a radio communications network that can use the decoder 306 for error correction is now described. FIG. 3 shows an example of a base station of a wireless communications system or network suitable for implementing the present invention. The system or network includes a number of subscriber stations, also referred to as remote terminals or user terminals, such as that shown in FIG. 4. The base station may be connected to a wide area network (WAN) through its host DSP 31 for providing any required data services and connections external to the immediate wireless system. To support spatial diversity, a plurality of antennas 3 is used, for example four antennas, although other numbers of antennas may be selected.

A set of spatial multiplexing weights for each subscriber station are applied to the respective modulated signals to produce spatially multiplexed signals to be transmitted by the bank of four antennas. The host DSP 31 produces and maintains spatial signatures for each subscriber station for each conventional channel and calculates spatial multiplexing and demultiplexing weights using received signal measurements. In this manner, the signals from the current active subscriber stations, some of which may be active on the same conventional channel, are separated and interference and noise suppressed. When communicating from the base station to the subscriber stations, an optimized multi-lobe antenna radiation pattern tailored to the current active subscriber station connections and interference situation is created. Suitable smart antenna technologies for achieving such a spatially directed beam are described, for example, in U.S. Pat. No. 5,828,658, issued Oct. 27, 1998 to Ottersten et al. and U.S. Pat. No. 5,642,353, issued Jun. 24, 1997 to Roy, III et al. The channels used may be partitioned in any manner. In one embodiment the channels used may be partitioned as defined in the GSM (Global System for Mobile Communications) air interface, or any other time division air interface protocol, such as Digital Cellular, PCS (Personal Communication System), PHS (Personal Handyphone System) or WLL (Wireless Local Loop). Alternatively, continuous analog or CDMA channels can be used.

The outputs of the antennas are connected to a duplexer switch 7, which in a TDD embodiment, may be a time switch. Two possible implementations of the duplexer switch are as a frequency duplexer in a frequency division duplex (FDD) system, and as a time switch in a time division duplex (TDD) system. When receiving, the antenna outputs are connected via the duplexer switch to a receiver 5, and are converted down in analog by RF receiver ("RX") modules 5 from the carrier frequency to an FM intermediate frequency ("IF"). This signal then is digitized (sampled) by analog to digital converters ("ADCs") 9. Final down-converting to baseband is carried out digitally. Digital filters can be used to implement the down-converting and the digital filtering, the latter using finite impulse response (FIR) filtering techniques. This is shown as block 13. The invention can be adapted to suit a wide variety of RF and IF carrier frequencies and bands.

There are, in the present example, eight down-converted outputs from each antenna's digital filter 13, one per receive timeslot. The particular number of timeslots can be varied to suit network needs. While GSM uses eight uplink and eight downlink timeslots for each TDMA frame, desirable results can also be achieved with any number of TDMA timeslots for the uplink and downlink in each frame. For each of the eight receive timeslots, the four down-converted outputs from the four antennas are fed to a digital signal processor (DSP) 17 (hereinafter "timeslot processor") for further processing, including calibration, according to one aspect of this invention. Eight Motorola DSP56300 Family DSPs can be used as timeslot processors, one per receive timeslot. The timeslot processors 17 monitor the received signal power and estimate the frequency offset and time alignment. They also determine smart antenna weights for each antenna element. These are used in the SDMA scheme to determine a signal from a particular remote user and to demodulate the determined signal.

The output of the timeslot processors 17 is demodulated burst data for each of the eight receive timeslots. This data is sent to the host DSP processor 31 whose main function is to control all elements of the system and interface with the higher level processing, which is the processing which deals with what signals are required for communications in all the different control and service communication channels defined in the system's communication protocol. The host DSP 31 can be a Motorola DSP56300 Family DSP. In addition, timeslot processors send the determined receive weights for each user terminal to the host DSP 31. The host DSP 31 maintains state and timing information, receives uplink burst data from the timeslot processors 17, and programs the timeslot processors 17. In addition it decrypts, descrambles, checks error correcting code, and deconstructs bursts of the uplink signals, then formats the uplink signals to be sent for higher level processing in other parts of the base station. Furthermore DSP 31 may include a memory element to store data, instructions, or hopping functions or sequences. Alternatively, the base station may have a separate memory element or have access to an auxiliary memory element. With respect to the other parts of the base station it formats service data and traffic data for further higher processing in the base station, receives downlink messages and traffic data from the other parts of the base station, processes the downlink bursts and formats and sends the downlink bursts to a transmit controller/modulator, shown as 37. The host DSP also manages programming of other components of the base station including the transmit controller/modulator 37 and the RF timing controller shown as 33.

The RF timing controller 33 interfaces with the RF system, shown as block 45 and also produces a number of timing signals that are used by both the RF system and the modem. The RF controller 33 reads and transmits power monitoring and control values, controls the duplexer 7 and receives timing parameters and other settings for each burst from the host DSP 31.

The transmit controller/modulator 37, receives transmit data from the host DSP 31. The transmit controller uses this data to produce analog IF outputs which are sent to the RF transmitter (TX) modules 35. Specifically, the received data bits are converted into a complex modulated signal, up-converted to an IF frequency, sampled, multiplied by transmit weights obtained from host DSP 31, and converted via digital to analog converters ("DACs") which are part of transmit controller/modulator 37 to analog transmit waveforms. The analog waveforms are sent to the transmit modules 35. The transmit modules 35 up-convert the signals to the transmission frequency and amplify the signals. The amplified transmission signal outputs are sent to antennas 3 via the duplexer/time switch 7.

User Terminal Structure

FIG. 4 depicts an example component arrangement in a remote terminal that provides data or voice communication. The remote terminal's antenna 45 is connected to a duplexer 46 to permit the antenna 45 to be used for both transmission and reception. The antenna can be omni-directional or directional. For optimal performance, the antenna can be made up of multiple elements and employ spatial processing as discussed above for the base station. In an alternate embodiment, separate receive and transmit antennas are used eliminating the need for the duplexer 46. In another alternate embodiment, where time division duplexing is used, a transmit/receive (TR) switch can be used instead of a duplexer as is well known in the art. The duplexer output 47 serves as input to a receiver 48. The receiver 48 produces a down-converted signal 49, which is the input to a demodulator 51. A demodulated received sound or voice signal 67 is input to a speaker 66.

The remote terminal has a corresponding transmit chain in which data or voice to be transmitted is modulated in a modulator 57. The modulated signal to be transmitted 59, output by the modulator 57, is up-converted and amplified by a transmitter 60, producing a transmitter output signal 61. The transmitter output 61 is then input to the duplexer 46 for transmission by the antenna 45.

The demodulated received data 52 is supplied to a remote terminal central processing unit 68 (CPU) as is received data before demodulation 50. The remote terminal CPU 68 can be implemented with a standard DSP (digital signal processor) device such as a Motorola series 56300 Family DSP. This DSP can also perform the functions of the demodulator 51 and the modulator 57. The remote terminal CPU 68 controls the receiver through line 63, the transmitter through line 62, the demodulator through line 52 and the modulator through line 58. It also communicates with a keyboard 53 through line 54 and a display 56 through line 55. A microphone 64 and speaker 66 are connected through the modulator 57 and the demodulator 51 through lines 65 and 66, respectively for a voice communications remote terminal. In another embodiment, the microphone and speaker are also in direct communication with the CPU to provide voice or data communications. Furthermore remote terminal CPU 68 may also include a memory element to store data, instructions, and hopping functions or sequences. Alternatively, the remote terminal may have a separate memory element or have access to an auxiliary memory element.

In one embodiment, the speaker 66, and the microphone 64 are replaced or augmented by digital interfaces well-known in the art that allow data to be transmitted to and from an external data processing device (for example, a computer). In one embodiment, the remote terminal's CPU is coupled to a standard digital interface such as a PCMCIA interface to an external computer and the display, keyboard, microphone and speaker are a part of the external computer. The remote terminal's CPU 68 communicates with these components through the digital interface and the external computer's controller. For data only communications, the microphone and speaker can be deleted. For voice only communications, the keyboard and display can be deleted.

General Matters

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

The present invention includes various steps. The steps of the present invention may be performed by hardware components, such as those shown in FIGS. 3 and 4, or may be embodied in machine-executable instructions, which may be used to cause a general-purpose or special-purpose processor or logic circuits programmed with the instructions to perform the steps. Alternatively, the steps may be performed by a combination of hardware and software. The steps have been described as being performed by either the base station or the user terminal. However, many of the steps described as being performed by the base station may be performed by the user terminal and vice versa. Furthermore, the invention is equally applicable to systems in which terminals communicate with each other without either one being designated as a base station, a user terminal, a remote terminal or a subscriber station. Thus, the present invention is equally applicable and useful in a peer-to-peer wireless network of communications devices using spatial processing. These devices may be cellular phones, PDA's, laptop computers, or any other wireless devices. Generally, since both the base stations and the terminals use radio waves, these communications devices of wireless communications networks may be generally referred to as radios.

In portions of the description above, only the base station is described as performing spatial processing using an antenna array. However, the user terminals can also contain antenna arrays, and can also perform spatial processing both on receiving and transmitting (uplink and downlink) within the scope of the present invention.

Embodiments of the present invention may be provided as a computer program product, which may include a machine-readable medium having stored thereon instructions, which may be used to program a computer (or other electronic devices) to perform a process according to the present invention. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions. Moreover, the present invention may also be downloaded as a computer program product, wherein the program may be transferred from a remote computer to a requesting computer by way of data signals embodied in a carrier wave or other propagation medium via a communication link (e.g., a modem or network connection).

Many of the methods and calculations are described in their most basic form, but steps can be added to or deleted from any of the methods and information can be added or subtracted from any of the described message signals without departing from the basic scope of the present invention. It will be apparent to those skilled in the art that many further modifications and adaptations can be made. The particular embodiments are not provided to limit the invention but to illustrate it. The scope of the present invention is not to be determined by the specific examples provided above but only by the claims below.

It should also be appreciated that reference throughout this specification to "one embodiment" or "an embodiment" means that a particular feature may be included in the practice of the invention. Similarly, it should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

What is claimed is:

1. A decoder comprising:
    a soft decoder to receive an extended codeword and a strength of each bit of the extended codeword, and to produce a codeword by soft decoding the extended codeword using the received strengths, the soft decoder including a parity checker to check a parity of the extended codeword, a soft error corrector to flip a weakest bit of the extended codeword based on the strength of each bit, and a bypass switch coupled to the parity checker that determines whether to pass the extended codeword to the soft error corrector based on the parity of the extended codeword; and
    a block decoder coupled to the soft decoder to produce a corrected codeword by block decoding the codeword using an error correcting block code.

2. The decoder of claim 1, wherein the block decoder can correct a predetermined odd number of bit errors in the codeword, and wherein the bypass switch passes the extended codeword to the soft decoder if the parity of the extended codeword indicates no errors.

3. The decoder of claim 1, wherein the block decoder can correct a predetermined even number of bit errors in the codeword, and wherein the bypass switch passes the extended codeword to the soft decoder if the parity of the extended codeword indicates an error.

4. The decoder of claim 1, wherein the block decoder comprises a linear block decoder.

5. The decoder of claim 4, wherein the block decoder comprises a Hamming decoder.

6. The decoder of claim 1, wherein the block decoder can correct a predetermined number of bit errors in the codeword, and wherein the decoder corrects one more than the predetermined number of bit errors in the codeword.

7. A communications device comprising:
    a receiver to receive a signal containing an extended codeword, and to extract the extended codeword and determine a strength of each bit of the extracted extended codeword by demodulating the signal;
    a soft decoder to produce a codeword by soft decoding the extended codeword using the received strengths, the soft decoder including a parity checker to check a parity of the extended codeword, a soft error corrector to flip a weakest bit of the extended codeword based on the strength of each bit, and a bypass switch coupled to the parity checker that determines whether to pass the extended codeword to the soft error corrector based on the parity of the extended codeword; and
    a block decoder coupled to the soft decoder to produce a corrected codeword by block decoding the codeword using an error correcting block code.

8. The communications device of claim 7, wherein the block decoder can correct a predetermined odd number of bit errors in the codeword, and wherein the bypass switch passes the extended codeword to the soft decoder if the parity of the extended codeword indicates no errors.

9. The communications device of claim 7, wherein the block decoder can correct a predetermined even number of bit errors in the codeword, and wherein the bypass switch passes the extended codeword to the soft decoder if the parity of the extended codeword indicates an error.

10. The communications device of claim 7, wherein the communications device comprises a radio.

11. The communications device of claim 10, wherein the radio comprises a user terminal of a wireless radio communications system.

12. The communications device of claim 10, wherein the communications device further comprises an antenna to receive radio signals coupled to the receiver.

13. An apparatus comprising:
    a parity checker to check a parity of an extended codeword;
    a soft error corrector to flip a weakest bit of the extended codeword;
    a bypass switch coupled to the parity checker that determines whether to pass the extended codeword to the soft error corrector based on the parity on the extended codeword;
    a parity bit remover to produce a codeword by removing a parity bit of the extended codeword; and
    a block decoder to produce a corrected codeword by block decoding the codeword using an error correcting block code.

* * * * *